United States Patent
Derovanessian et al.

(10) Patent No.: US 9,247,676 B2
(45) Date of Patent: Jan. 26, 2016

(54) ELECTRONIC DEVICE COOLING SYSTEMS

(71) Applicant: The DIRECTV Group, Inc., El Segundo, CA (US)

(72) Inventors: Henry Derovanessian, Manhattan Beach, CA (US); Robin M. Mathews, Westford, MA (US)

(73) Assignee: The DIRECTV Group, Inc., El Segundo, CA (US)

( * ) Notice: Subject to any disclaimer, the term of this patent is extended or adjusted under 35 U.S.C. 154(b) by 225 days.

(21) Appl. No.: 13/967,011

(22) Filed: Aug. 14, 2013

(65) Prior Publication Data

US 2015/0049438 A1 Feb. 19, 2015

(51) Int. Cl.
| | |
|---|---|
| *H05K 7/20* | (2006.01) |
| *G06F 1/20* | (2006.01) |
| *H05K 9/00* | (2006.01) |
| *H05K 5/00* | (2006.01) |
| *F28F 7/00* | (2006.01) |
| *H01L 23/34* | (2006.01) |

(52) U.S. Cl.
CPC .............. *H05K 7/20418* (2013.01); *F28F 7/00* (2013.01); *G06F 1/20* (2013.01); *H01L 23/34* (2013.01); *H05K 5/00* (2013.01); *H05K 7/20* (2013.01); *H05K 7/20463* (2013.01); *H05K 9/00* (2013.01)

(58) Field of Classification Search
CPC ............. H05K 7/20; H05K 5/00; H05K 5/02; H05K 9/00; F28F 13/12; F28F 7/00; F28F 15/00; G06F 1/20; H01L 23/34; F25D 23/12
USPC ........................ 361/679.46–679.54, 690–694, 361/704–715, 719–727; 165/80.2, 80.3, 165/104.33, 121–126, 185; 174/17 SF, 174/17 VA, 48, 50, 50.51, 520; 312/223.2, 312/223.3, 236, 265.1
See application file for complete search history.

(56) References Cited

U.S. PATENT DOCUMENTS

| | | | | |
|---|---|---|---|---|
| 3,699,394 | A | * | 10/1972 | Schuler ........................ 361/714 |
| 4,471,407 | A | * | 9/1984 | Sleder ......................... 361/707 |
| 5,880,933 | A | | 3/1999 | Markow et al. |
| 6,143,978 | A | * | 11/2000 | Ren et al. ................... 174/17 SF |
| 6,201,696 | B1 | * | 3/2001 | Shimizu et al. ............... 361/704 |
| 6,549,409 | B1 | * | 4/2003 | Saxelby et al. ............... 361/704 |
| 6,821,816 | B1 | * | 11/2004 | Lawlyes ...................... 438/108 |
| 7,595,468 | B2 | * | 9/2009 | Moon et al. .................. 219/540 |
| 8,130,496 | B2 | * | 3/2012 | Dong et al. .................. 361/700 |
| 2010/0202111 | A1 | | 8/2010 | Liang |
| 2012/0287582 | A1 | * | 11/2012 | Vinciarelli et al. .......... 361/728 |
| 2013/0021754 | A1 | * | 1/2013 | Lu et al. ...................... 361/714 |
| 2014/0254800 | A1 | * | 9/2014 | Derby .......................... 380/270 |

OTHER PUBLICATIONS

International Search Report and Written Opinion dated Nov. 10, 2014 in International Application No. PCT/US2014/050630 filed Aug. 12, 2014 by Henry Derovanessian et al.

* cited by examiner

*Primary Examiner* — Michail V Datskovskiy (57) ABSTRACT

An electronic device includes: a housing having one or more interior surfaces; an electronic circuit that is disposed within the housing, that does not directly contact any of the one or more interior surfaces of the housing, and that includes at least one electrical component that consumes electrical power; and a thermally conductive material that surrounds the electronic circuit within the housing, that directly contacts both the at least one electrical component and the one or more interior surfaces of the housing, that absorbs heat from the at least one electrical component, and that transfers heat to the housing.

19 Claims, 9 Drawing Sheets

FIG. 15

ELECTRONIC DEVICE COOLING SYSTEMS

TECHNICAL FIELD

The present disclosure relates to wireless data transmission and reception systems and devices and more particularly to cooling systems for electronic devices.

BACKGROUND

The statements in this section merely provide background information related to the present disclosure and may not constitute prior art.

Satellite television has become increasingly popular due to the wide variety of content and the quality of content available. A satellite television system typically includes a set top box that receives satellite signals and decodes the satellite signals for use on a television. The set top box typically includes a memory, such as for storing operating code of the set top box. Some set top boxes a digital video recorder or the like for storing received content. Because of the numerous components associated with the set top box, having one set top box for each individual television may be relatively expensive.

Satellite television systems typically broadcast content to a number of users simultaneously. Satellite television systems also offer subscription or pay-per-view access to broadcast content. Access to subscription or pay-per-view content may be provided using signals broadcast over the satellite. Once access is provided, a user can access particular content.

Electronic devices are increasingly accessing the Internet. For example, some flat panel televisions may connect to the Internet, wirelessly and/or by wire, to enhance the customer experience and provide additional viewing options. Electronic devices may access various content sources via the Internet, such as movie and other video sources, weather data sources, stock data sources, etc.

SUMMARY

In a feature, a wireless communication device includes: a plurality of heat transfer fins; a first antenna; a second antenna; a wireless transmitter; and a wireless receiver. The plurality of heat transfer fins project outwardly from the wireless communication device, receive heat produced by electric components of the wireless communication device, and transfer heat to air passing the heat transfer fins. The first antenna is disposed at least partially within a first recess formed in a first exterior surface of a first one of the heat transfer fins and contacts at least a portion of the first recess. The second antenna is disposed at least partially within a second recess formed in a second exterior surface of a second one of the heat transfer fins and contacts at least a portion of the second recess. The wireless transmitter applies first signals to the first antenna to wirelessly transmit signals via the first antenna. The wireless receiver receives second signals generated by the second antenna.

In a feature, an electronic device includes: a housing having one or more interior surfaces; an electronic circuit that is disposed within the housing, that does not directly contact any of the one or more interior surfaces of the housing, and that includes at least one electrical component that consumes electrical power; and a thermally conductive material that surrounds the electronic circuit within the housing, that directly contacts both the at least one electrical component and the one or more interior surfaces of the housing, that absorbs heat from the at least one electrical component, and that transfers heat to the housing.

Further areas of applicability will become apparent from the description provided herein. It should be understood that the description and specific examples are intended for purposes of illustration only and are not intended to limit the scope of the present disclosure.

DRAWINGS

The drawings described herein are for illustration purposes only and are not intended to limit the scope of the present disclosure in any way.

DETAILED DESCRIPTION

The following description is merely exemplary in nature and is not intended to limit the present disclosure, application, or uses. For purposes of clarity, the same reference numbers will be used in the drawings to identify similar elements.

Electronic devices, such as set top boxes, network gateway devices, and digital video recorders, consume power and generate heat. Typically, electronic devices include one or more fans and/or one or more heat pipes to provide cooling. Fans and heat pipes rely on convection to accomplish a majority of the cooling that they provide. Fans and heat pipes, however, are costly and, to some extent, limit housing designs due to the need for air flow for convection. Additionally, a fan consumes energy to provide cooling, which decreases the actual cooling benefit provided by the fan.

An electronic device of the present disclosure includes electronic components, such as a wireless transceiver and/or other electronic components. The electronic components are disposed within a housing. The electronic components are maintained within the housing as to not directly contact any interior surface of the housing. Areas surrounding the electronic components, between the electronic components and the interior surface(s) of the housing, are filled with a thermally conductive material. For example, the thermally conductive material may be a gel, a paste, a semisolid, or a colloid.

The thermally conductive material directly contacts both the electronic components and the interior surface(s) of the housing. The thermally conductive material conducts heat from the electronic components to the housing so the heat can be transferred to the surroundings. The thermally conductive material may also electrically isolate the electronic components from the housing.

Use of the thermally conductive material may decrease the cost of the electronic device relative to use of one or more cooling fans and/or heat pipes. Use of the thermally conductive material may also enable the housing to be designed such that it is more attractive and/or smaller than if one or more cooling fans and/or heat pipes are used. Heat transfer fins may be attached to or formed on exterior surfaces of the housing to increase the effective surface area available for cooling.

Typically, wireless communication devices have one or more antennas that extend outwardly relative to a housing to provide better data transmission and reception. Such antennas, however, are unsightly, even when their size is limited in an effort to positively affect device appearance. Limiting the size of the antennas may also decrease the data transmission and/or reception performance of the antennas.

The electronic device according to the present disclosure includes antennas that are integrated into the heat transfer fins. For example, the heat transfer fins may include recesses formed on individual fins, and the antennas may be held within the recesses, respectively. Integrating the antennas into the heat transfer fins may effectively hide the antennas from view and enable the electronic device to have an aesthetically pleasing exterior, despite the presence of the antennas. Additionally, the size of the antennas and/or the number of antennas integrated into individual heat transfer fins may be maximized to increase data transmission and/or reception performance.

Figure 1:
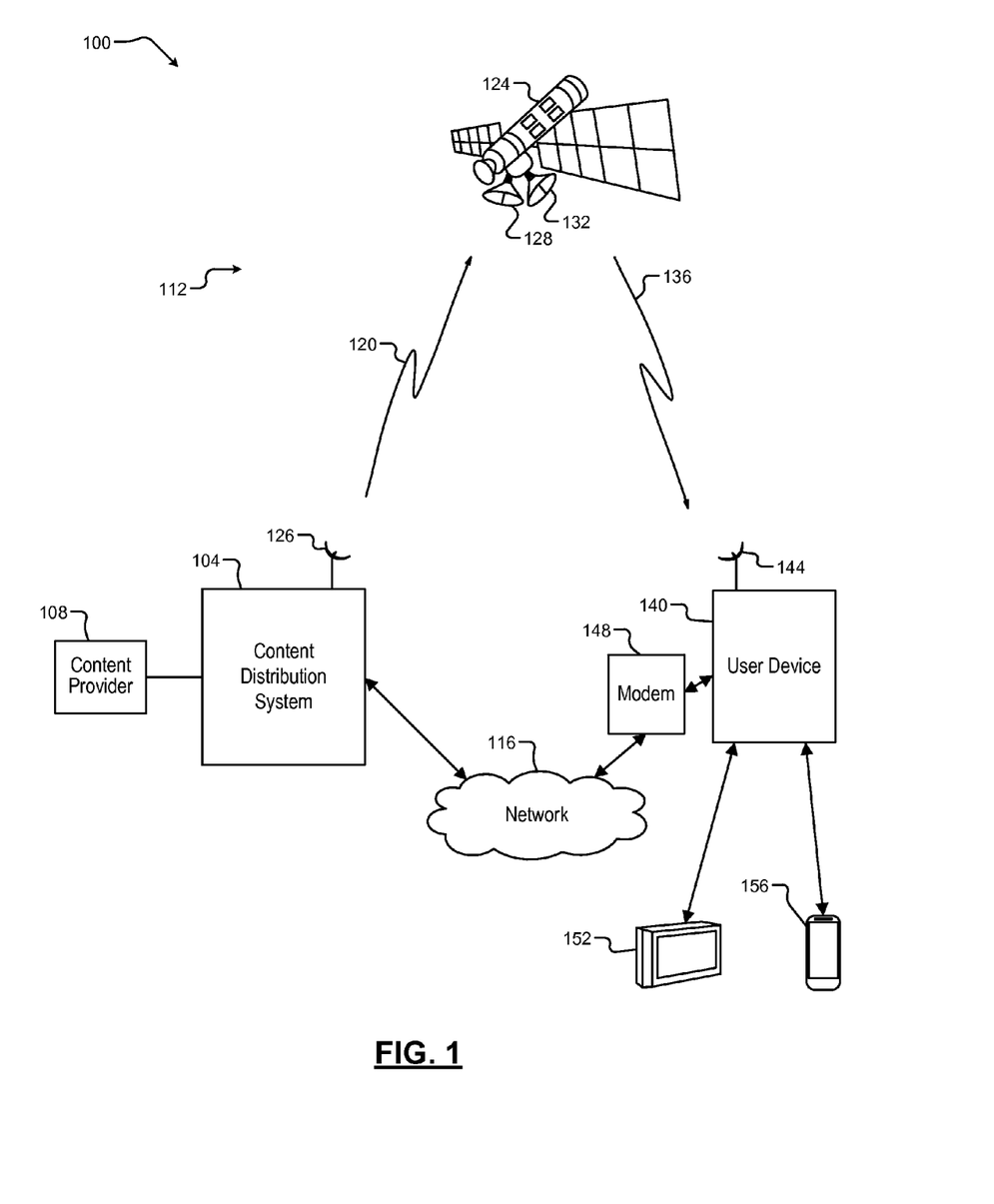
FIG. 1 is a high level functional block diagram of an example satellite distribution system according to the present disclosure.

Referring now to FIG. 1, a functional block diagram of an example communication system 100 is illustrated. A content distribution system 104 receives content from a plurality of content providers, such as content provider 108. The content distribution system 104 communicates content and other data to users via one or more communication networks, such as a content delivery system 112 and/or a network 116, such as an Internet Protocol (IP) network.

While the content delivery system 112 is shown and will be described as being a satellite content delivery system, the content delivery system 112 may be another suitable type of content delivery system, such as, but not limited to, a wired content delivery system, a wireless content delivery system, a cable content delivery system, and/or a high frequency content delivery system.

Carrying through with the satellite content delivery system example, the content distribution system 104 generates uplink signals 120 and communicates the uplink signals 120 to one or more satellites, such as satellite 124. The content distribution system 104 communicates the uplink signals 120 to the satellite(s) via an antenna 126.

The satellite 124 includes a receiving antenna 128 and a transmitting antenna 132. The satellite 124 receives the uplink signals 120 via the receiving antenna 128. The satellite 124 generates downlink signals 136 based on the uplink signals 120 and transmits the downlink signals 136 to a plurality of user devices, such as user device 140. For example, the satellite 124 may transmit the downlink signals 136 over a geographical area for reception by user devices located within that geographical area. The satellite 124 transmits the downlink signals 136 via the transmitting antenna 132.

The user device 140 may include, for example, a set-top box, a digital video recorder (DVR), a network gateway, or a combination set-top box/DVR/network gateway, or another suitable type of user device. The user device 140 may be used in a fixed setting, such as in a building. Additionally or alternatively, the user device 140 may be used in a mobile setting, such as in a vehicle (e.g., plain, train, automobile, etc.).

The user device 140 receives the downlink signals 136 via an antenna 144. The antenna 144 may be fixed in a single direction (e.g., when used in a fixed setting) or may be a tracking antenna in various implementations (e.g., when used in a mobile setting). One or more cables for communicating audio/visual (A/V) signals may be connected between the antenna 144 and the user device 140.

The user device 140 may also receive A/V data via the network 116, such as from the content distribution system 104 and/or one or more other data sources that can be accessed via the network 116. The user device 140 may communicate via the network 116 via one or more networking devices, such as a modem 148 and/or a telephone (not shown). The user device 140 may also receive A/V signals via one or more radio frequency (RF) antennas (not shown).

The user device 140 generates A/V signals based on received signals and transmits A/V signals to one or more output devices, such as a display 152. In various implementations, the user device 140 may be implemented within a display. The user device 140 may store A/V data in a computer-readable medium (e.g., within the user device 140), for example, for transmission at a later time as commanded by a user.

The user device 140 may also wirelessly communicate with one or more mobile devices, such as mobile device 156. Examples of mobile devices include, but are not limited to, personal media devices, cellular phones, tablet computers, personal computers, and other types of electronic devices. For example, the user device 140 may communicate wirelessly using an IEEE 802.11 wireless communication standard, a Bluetooth communication standard, a Zigbee communication standard, and/or one or more other suitable wireless communication standards.

Due to the increased number and complexity of electronic components implemented in electronic devices, such as the user device 140 or the mobile device 156, power consumption of such devices has increased over time. As power consumption increases, heat production also increases. Electronic devices typically include heat dissipation devices that dissipate heat produced to increase reliability and to increase mean time between faults (MTBF). For example, an electronic device may include one or more cooling fans and/or one or more heat pipes to dissipate heat produced by electronic components of the electronic device.

The present disclosure describes an electronic device having electronic components that are surrounded by a thermally-conductive material, such as a gel, a paste, a semisolid, or a colloid. Semisolids have qualities of both liquids and solids. Semisolids are more viscous and more rigid than liquids but are less viscous and less rigid than solids. The thermally conductive material conducts heat from the electronic components to a casing of the user device. Heat transfer fins may be formed on an exterior surface of the casing or attached to an exterior surface of the casing to facilitate heat transfer from the casing to ambient air.

The thermally conductive material and the casing therefore transfer heat away from the electronic components without the need for one or more fans and/or one or more heat pipes.

This may decrease the cost of the user device as use of the thermally conductive material may be less costly than a design including one or more fans and/or heat pipes. Additionally, an electronic device including the thermally conductive material may consume less energy than an electronic device including a cooling fan and/or a heat pipe as fans and heat pipes may consume energy to provide cooling. Moreover, use of the thermally conductive material may enable slimmer and/or more attractive packaging designs to be used as the need to provide additional space for one or more fans and/or heat pipes may be minimized or eliminated.

Figure 2:
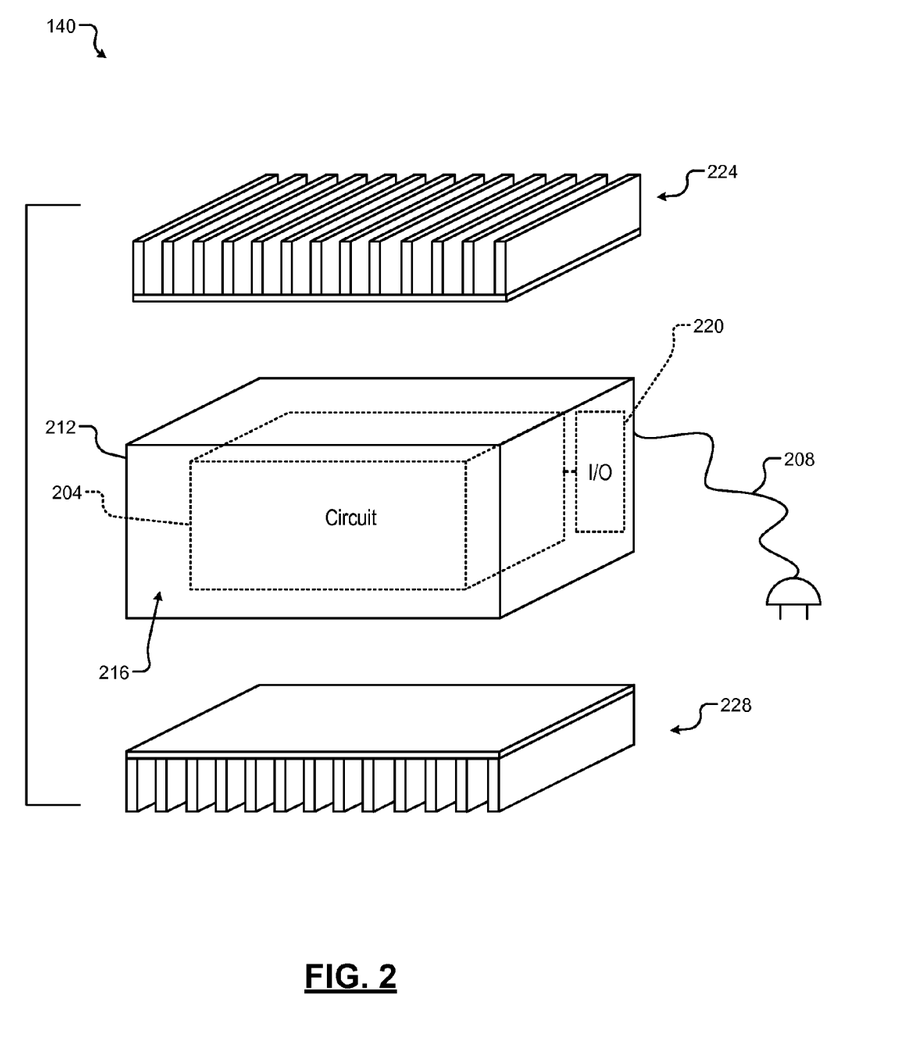
FIG. 2 is an example profile view of an electronic device according to the present disclosure.
Figure 3:
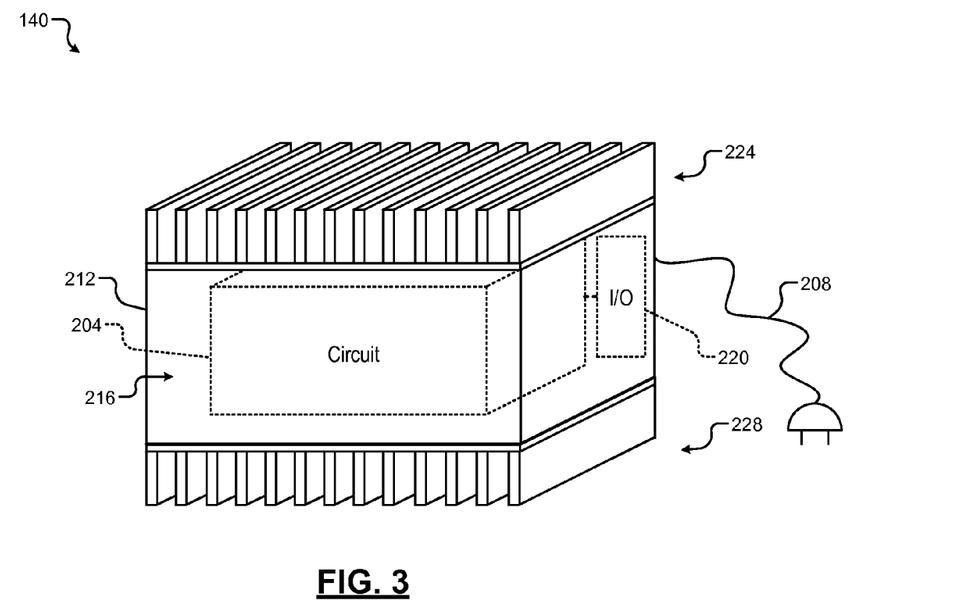
FIG. 3 is an example exploded view of the electronic device according to the present disclosure.
Figure 4:
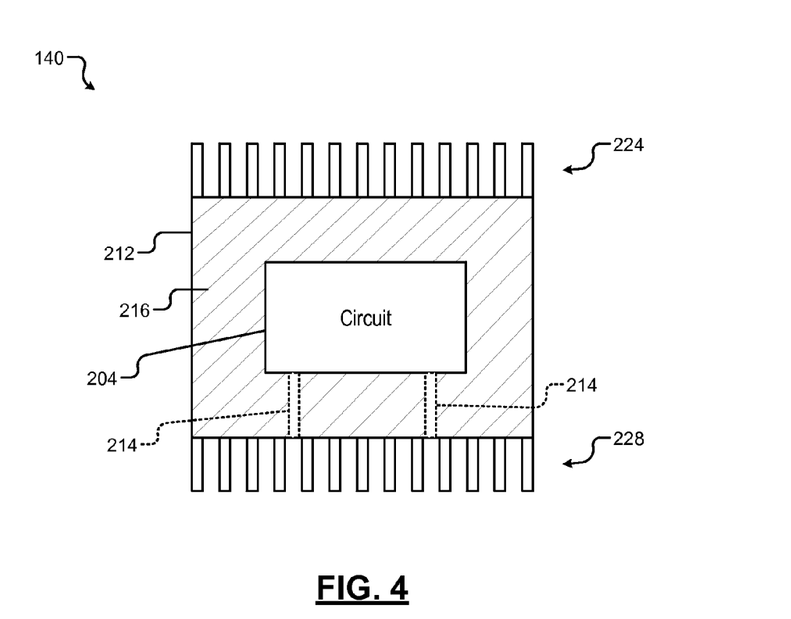
FIG. 4 is an example cross sectional view of the electronic device according to the present disclosure.

FIG. 2 is an example profile view of the user device 140. FIG. 3 is an example exploded view of the user device 140. FIG. 4 is an example cross sectional view of the user device 140. Referring now to FIGS. 2-4, the user device 140 includes one or more electronic components. For example only, the electronic components may include a tuner, a demodulator, a decoder, a DVR, a network gateway, a wireless transceiver, an alternating current (AC) to direct current (DC) converter, and/or other suitable electronic components.

The electronic components of the user device 140 are implemented on one or more circuit boards. The electronic components of the user device 140 and the one or more circuit boards are collectively illustrated by electronic circuit 204. While only the electronic circuit 204 is shown and the following description will be made using the single electronic circuit example, the electronic components of the user device 140 may be implemented on two or more electrically connected circuits.

The user device 140 may receive power via a standard wall outlet. The user device 140 may connect to standard wall outlets via a power cable and plug 208. The user device 140 may additionally or alternatively receive power via one or more internal batteries (not shown), which may be rechargeable. The power cable 208 may be permanently connected to the user device 140, or the power cable 208 may be connectable and disconnectable.

The electronic circuit 204 is housed within a casing 212. While the casing 212 is shown as being a rectangular casing, the casing 212 may be another suitable shape. The electronic circuit 204 is held within the casing 212 as to not directly contact any interior surface of the casing 212. For example, the electronic circuit 204 may be coupled to a plurality of legs 214 (see FIG. 4) or other types of supports that maintain the electronic circuit 204 away from the interior surfaces of the casing 212.

The electronic circuit 204 is surrounded by a thermally conductive material 216, such as a gel, a paste, a semisolid, or a colloid. A dielectric liquid or another suitable type of injectable, thermally conductive material may be used in place of the thermally conductive material 216 in various implementations. Thermally conductive may mean having a thermal conductivity that is greater than a predetermined value.

In the example cross-sectional view of FIG. 4, the thermally conductive material 216 is illustrated by hatching. The casing 212 may be filed with the thermally conductive material 216 as to fill the space within the casing 212 that is not occupied by the electronic circuit 204. The thermally conductive material 216 may be electrically insulative (e.g., have a dielectric value that is greater than a predetermined value). Further description of the thermally conductive material 216 is provided below.

The user device 140 includes various input/output (I/O) connectors 220. Various types of wires and connectors can be connected to the electronic circuit 204 via the I/O connectors 220. For example, the I/O connectors 220 may include one or more coaxial connectors, one or more optical connectors, one or more ATA connectors, one or more A/V connectors, one or more S-video connectors, one or more HDMI connectors, one or more Ethernet connectors, one or more phone connectors, one or more RF connectors, one or more satellite connectors, one or more Universal Serial Bus (USB) connectors, one or more National Television System Committee (NTSC) connectors, and/or other suitable types of connectors. The electronic circuit 204 receives signals via wires connected to input connectors. The electronic circuit 204 outputs signals via wires connected to output connectors. The electronic circuit 204 may also wirelessly transmit and/or receive signals, as discussed further below.

The user device 140 may include heat transfer fins, such as heat transfer fins 224 and 228. While the two sets of heat transfer fins are shown, the user device 140 may include additional or fewer sets of heat transfer fins. Further, while rectangular prism shaped heat transfer fins are shown, the heat transfer fins may be another suitable shape. The number of heat transfer fins (e.g., per set) may be greater or less than that shown. The heat transfer fins may be formed on an exterior surface of the casing 212 or may be implemented separately and fixed to the casing 212 such that the heat transfer fins are in direct contact with the exterior of the casing 212.

The electrical components of the user device 140 have a predetermined maximum power consumption. The predetermined maximum power consumption may correspond to a maximum possible amount of power that the electrical components can consume as a whole at any given time.

Characteristics of the thermally conductive material 216, the casing 212, and the heat transfer fins 224 and 228 may be selected based on the predetermined maximum power consumption and predetermined dimension requirements for the user device 140. More specifically, characteristics of the thermally conductive material 216, the casing 212, and the heat transfer fins 224 and 228 may be selected to achieve a heat dissipation corresponding to the predetermined maximum power consumption while satisfying the predetermined dimension requirements. For example only, the characteristics of the thermally conductive material may include the type of material used, the amount of material used, and other suitable characteristics. The characteristics of the casing and the heat transfer fins may include dimensions, shape, materials used, and other suitable characteristics. For example, as the predetermined maximum power consumption of a device increases, characteristics of the thermally conductive material 216, the casing 212, and the heat transfer fins 224 and 228 may be selected to increase heat dissipation, and vice versa.

In operation, the electronic circuit 204 consumes electrical power and produces heat. As the thermally conductive material 216 contacts the electronic circuit 204, the thermally conductive material 216 draws heat from the electronic circuit 204 via conduction. The thermally conductive material 216 may include carbon or another suitable material to draw heat away from the electronic circuit 204 as evenly as possible and to transfer heat as evenly as possible to the casing 212. The thermally conductive material 216 transfers heat to the casing 212 via conduction. If the casing 212 and the heat transfer fins 224 and 228 are separate components, the casing 212 transfers heat to the heat transfer fins 224 and 228 via conduction.

The heat transfer fins 224 and 228 transfer heat to ambient air via convection. Portions of the casing 212 that do not contact heat transfer fins may also transfer heat to ambient air via convection. The heat transfer fins 224 and 228 provide increased surface area for increased heat transfer to the surroundings.

For example only, the thermally conductive material 216 may be a carbon based dielectric thermally conductive material or another suitable type of material. In various implementations, the thermally conductive material 216 may be used to support the electronic circuit 204 as to not contact any interior portion of the casing 212, and the legs and/or other supporting members may be omitted.

The casing 212 may be electrically conductive. For example, the casing 212 and the heat transfer fins 224 and 228 may be made of one or more metals, such as Aluminum. In various implementations, the casing 212 and the heat transfer fins 224 and 228 may be made of an electrically non-conductive (i.e., insulative) material, such as a thermally conductive plastic.

Figure 5:
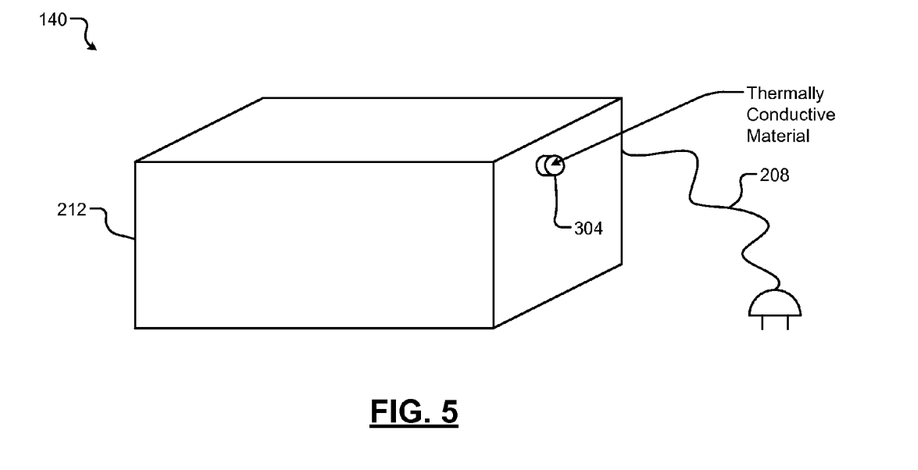
FIG. 5 is a an example profile view of a casing of the electronic device according to the present disclosure.

The thermally conductive material 216 may be filled into the areas surrounding the electronic circuit 204 in various ways. For example, FIG. 5 includes an example profile view of the casing 212 of the user device 140. The casing 212 may include an inlet 304, such as one-way valve. The thermally conductive material 216 may be pumped into the casing 212 from a source via the inlet 304.

Figure 6:
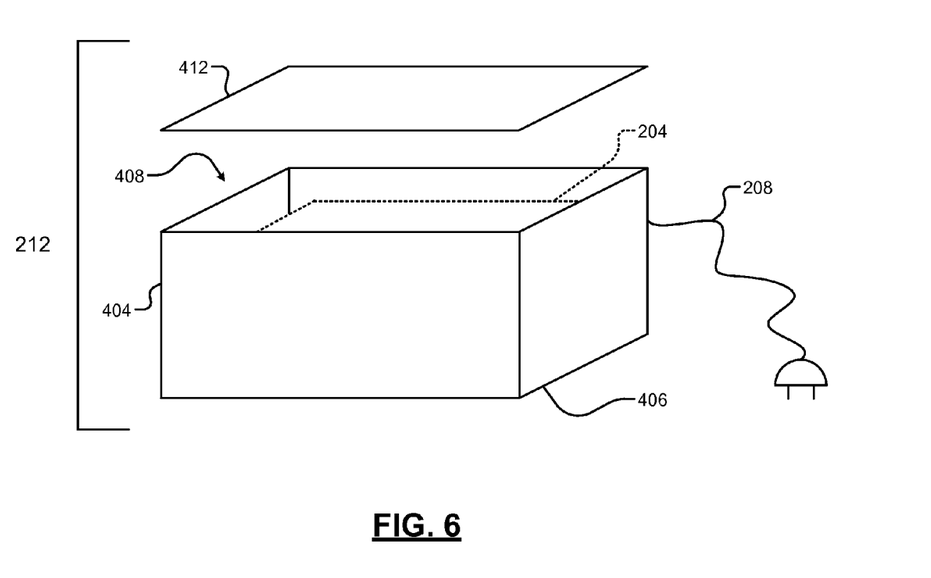
FIG. 6 is an example exploded view of a casing of the electronic device according to the present disclosure.

For another example, FIG. 6 includes an example exploded view of the casing 212 of the user device 140. Walls 404 of the casing 212 may extend away from a base 406 and form an opening 408. The thermally conductive material 216 may be filled into the casing 212 in the areas surrounding the electronic circuit 204 via the opening 408. The thermally conductive material 216 may be filled into the casing 212 before and/or after the electronic circuit 204 is inserted into the casing 212. An end portion 412 of the casing 212 may cover the opening 408 and may be fixed to the walls 404 to seal the casing 212. The end portion 412 may be fixed to the walls 404, for example, using an adhesive, by welding, or in another suitable manner.

Figure 7:
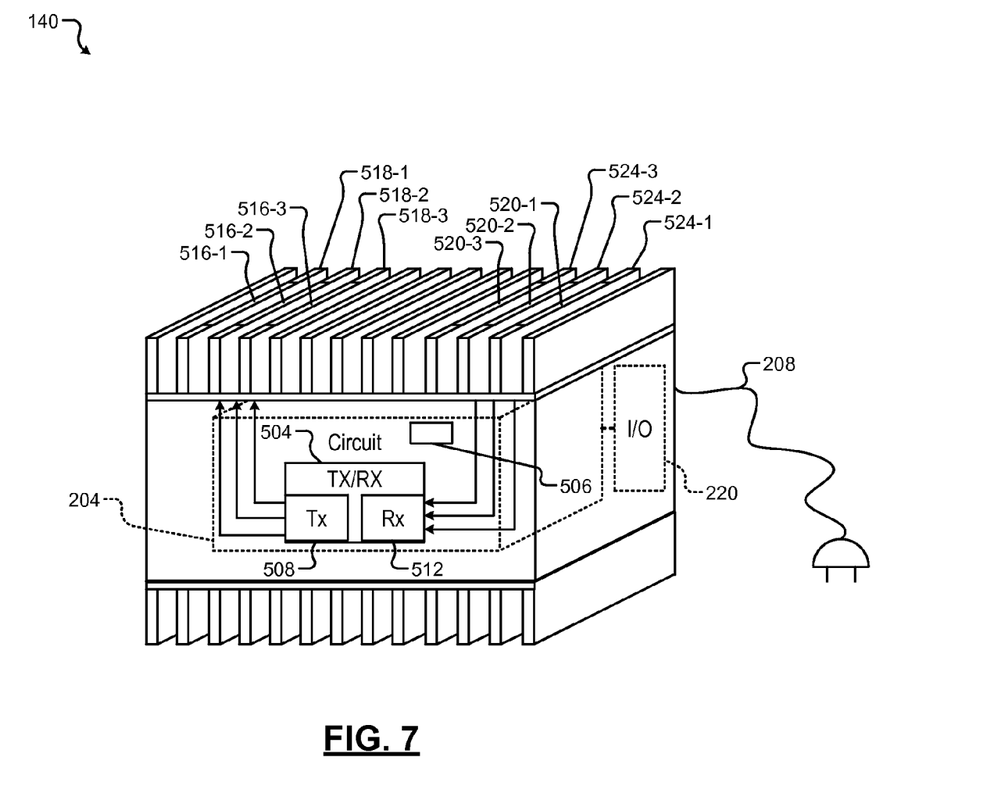
FIG. 7 is an example perspective view of an electronic device according to the present disclosure.

Referring now to FIG. 7, another example perspective view of the user device 140 is presented. The user device 140 includes a transceiver 504 that transmits and receives data wirelessly. For example, the transceiver 504 may include, for example, a transceiver that communicates according to an IEEE 802.11 wireless communication standard or another suitable wireless communication standard. The user device 140 may also include one or more other electronic devices, collectively illustrated by 506. The other electronic devices 506 may include, for example, a second transceiver or network gateway that transmits and receives data by one or more wires, such as to and from the modem 148 to communicate via the network 116. The other electronic devices 506 may also include a digital video recorder (DVR) that stores A/V data in a computer readable medium, a receiver device that receives A/V signals from a satellite via a satellite antenna and that outputs A/V signals to a display, and/or other suitable types of devices.

The transceiver 504 includes a transmitter 508 and a receiver 512. The transmitter 508 is electrically connected to one or more transmit antennas, such as first, second, and third transmit antennas 516-1, 516-2, and 516-3 (collectively "transmit antennas 516"). The transmitter 508 wirelessly transmits data via the transmit antennas 516. While the example of three transmit antennas is shown and discussed, the number of transmit antennas may be one, two, or more.

The transmit antennas 516 are integrated into respective ones of the heat transfer fins of the user device 140. For example, the transmit antennas 516 may be integrated into first, second, and third heat transfer fins 518-1, 518-2, and 518-3 (collectively "fins 518"), respectively.

The receiver 512 is electrically connected to one or more receive antennas, such as first, second, and third receive antennas 520-1, 520-2, 520-3 (collectively "receive antennas 520"). The receiver 512 wirelessly receives data via the receive antennas 520. While the example of three receive antennas is shown and discussed, the number of receive antennas may be one, two, or more. The number of transmit antennas and the number of receive antennas implemented need not be equal. Transceivers utilizing two or more transmit antennas and two or more receive antennas may be referred to as multiple-input multiple-output (MIMO) transceivers.

The receive antennas 520 are integrated into respective ones of the heat transfer fins of the user device 140. For example, the receive antennas 520 may be integrated into third, fourth, and fifth heat transfer fins 524-1, 524-2, and 524-3 (collectively "fins 524"), respectively.

Figure 8:
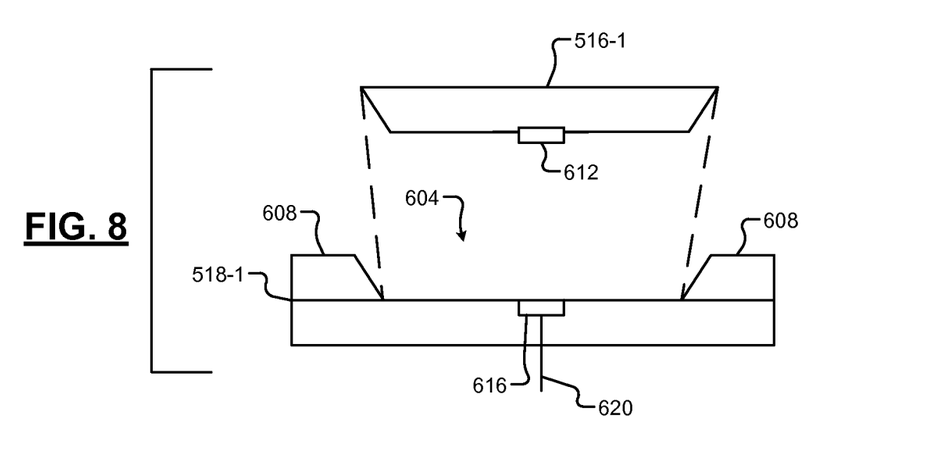
FIGS. 8-9 are example exploded, cross-sectional views of a heat transfer fin and an antenna according to the present disclosure.

FIG. 8 is an example exploded, cross-sectional view of the first heat transfer fin 518-1 and the first transmit antenna 516-1. While only integration of the first heat transfer fin 518-1 and the first transmit antenna 516-1 are shown and will be discussed in detail, the following is equally applicable to other heat transfer fins and other antennas.

A recess 604 is formed in an exterior (e.g., top) surface 608 of the first heat transfer fin 518-1. The recess 604 is shaped and sized such that the first transmit antenna 516-1 can be inserted into the recess 604. In other words, the recess 604 is shaped to receive the first transmit antenna 516-1. For example only, the first transmit antenna 516-1 may have the shape of a trapezoidal prism as shown in FIG. 8, and the recess 604 may be shaped to receive the trapezoidal prism. However, the first transmit antenna 516-1 (and the recess 604) may have another suitable shape. A depth of the recess may be approximately equal to a height of the first transmit antenna 516-1 such that an exposed surface of the first transmit antenna 516-1, when inserted into the recess 604, will be approximately flush with the exterior surface 608 of the first heat transfer fin 518-1.

The first transmit antenna 516-1 may include a first electrical connector 612. The first electrical connector 612 may connect with a second electrical connector 616 when the first transmit antenna 516-1 is inserted into the recess 604. One or more wires, such as wire 620, may be connected between the second electrical connector 616 and the electronic circuit 204 such that the first transmit antenna 516-1 is electrically connected to the transmitter 508 when the first and second electrical connectors 612 and 616 are coupled. Other connectors may connect receive antennas with the receiver 512.

Figure 9:
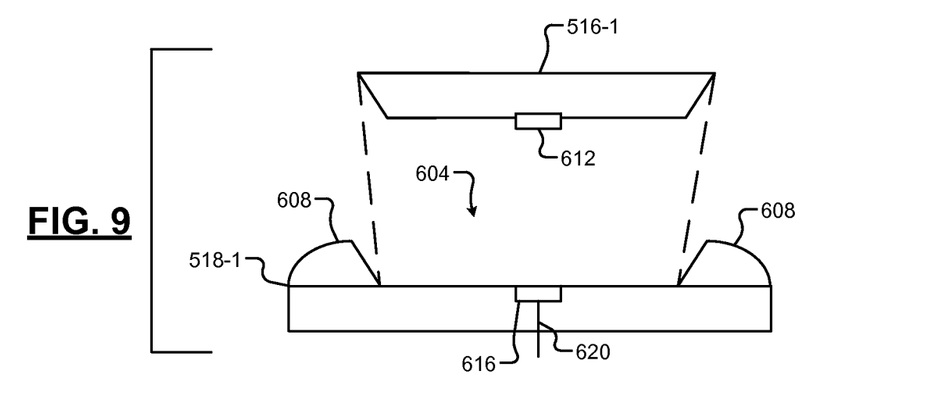
Figure 10:
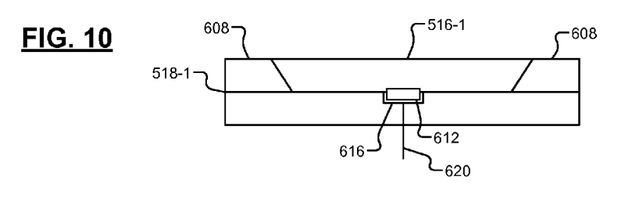
FIGS. 10-11 are example cross-sectional views of the heat transfer fin and the antenna according to the present disclosure.
Figure 11:
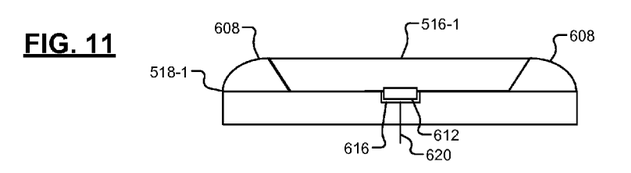

As stated above, the shape of the heat transfer fins may be any suitable shape, such as rectangular prism as illustrated in FIG. 8. FIG. 9 is another example exploded, cross-sectional view illustrating the first heat transfer fin 518-1 where the exterior surface 608 is rounded. FIGS. 10 and 11 are example cross-sections similar to those of FIGS. 8 and 9, respectively, with the first transmit antenna 516-1 inserted into the recess 604.

Figure 12:
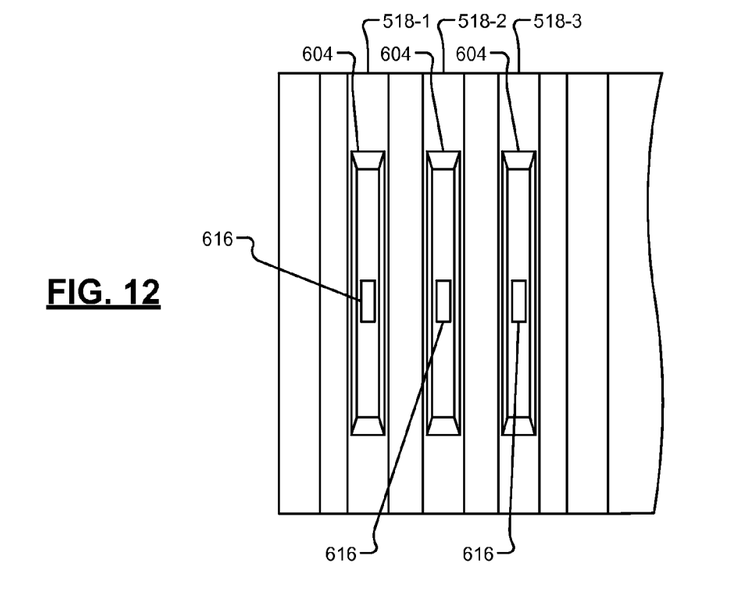
FIG. 12 is an example top view of a heat transfer fin including a recess for receiving an antenna.
Figure 13:
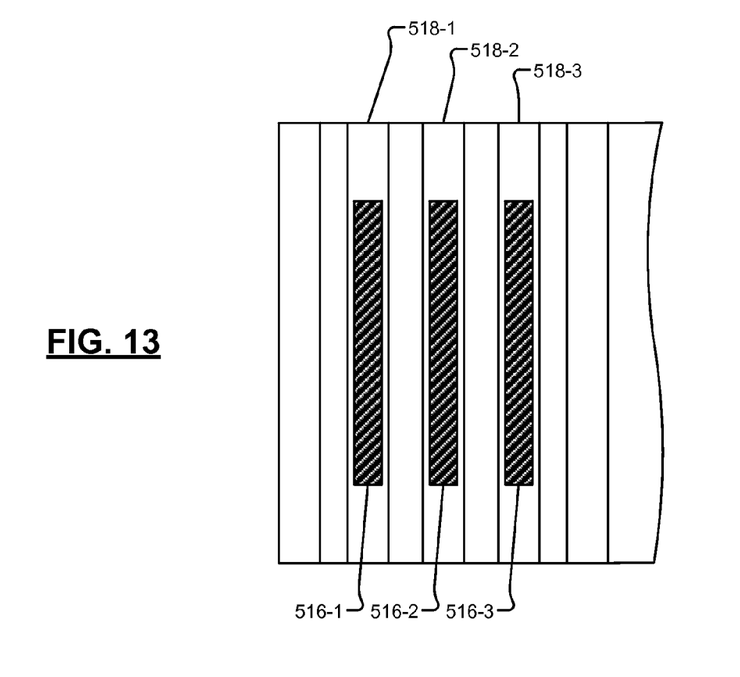
FIG. 13 is an example top view of a heat transfer fin and an antenna.
Figure 14:
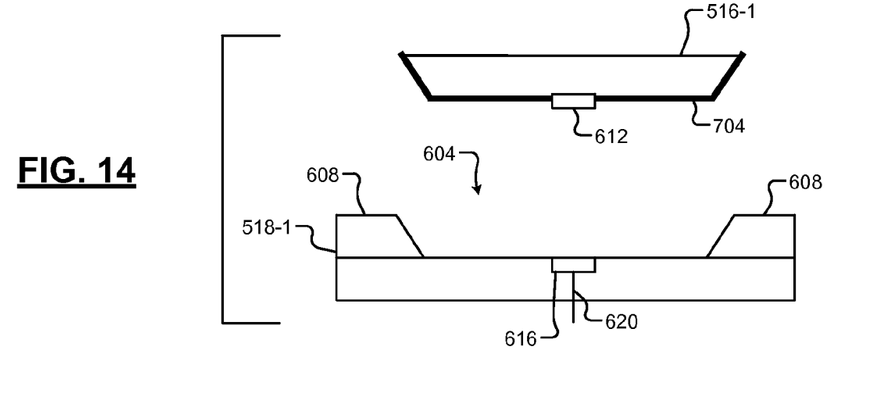
FIGS. 14-15 are example cross-sectional views of a heat transfer fin, an antenna, and an electrical isolator according to the present disclosure.
Figure 15:
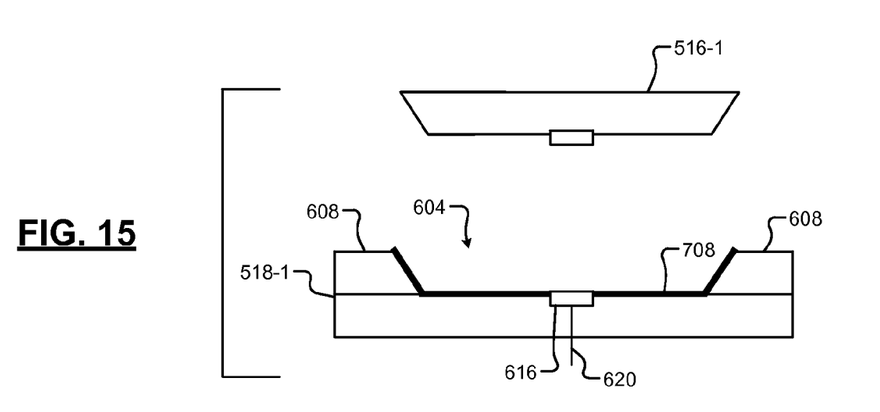

FIG. 11 is an example top view of the heat transfer fins 518 before insertion of the transmit antennas 516. FIG. 12 is an example top view of the heat transfer fins 518 with the transmit antennas 516 inserted into the recess 604. In FIG. 12, the transmit antennas 516 are depicted using hatching.

As stated above, the heat transfer fins may be made of one or more electrically conductive materials in various implementations, such as one or more metals. When the heat transfer fins are made of one or more electrically conductive materials, an electrical insulator may be applied to exterior surfaces of each of the transmit and receive antennas 516 and 520 at locations where the transmit and receive antennas 516 and 520 would directly contact the heat transfer fins.

For example, FIG. 11 includes an example cross-sectional view of the first heat transfer fin 518-1 and the first transmit antenna 516-1. Again, while only the first heat transfer fin 518-1 and the first transmit antenna 516-1 are shown and will be discussed, the following is equally applicable to other heat transfer fins and other antennas.

In FIG. 11, an electrical insulator 704 is applied to exterior surfaces of the first transmit antenna 516-1 that may otherwise contact the first heat transfer fin 518-1. The electrical insulator 704 electrically insulates the first transmit antenna 516-1 from the first heat transfer fin 518-1.

FIG. 12 also includes an example cross-sectional view of the first heat transfer fin 518-1 and the first transmit antenna 516-1. In FIG. 12, an electrical insulator 708 is applied to exterior surfaces of the first heat transfer fin 518-1, such as the recess 604. As in FIG. 11, the electrical isolator 708 electrically isolates the first transmit antenna 516-1 from the first heat transfer fin 518-1. In various implementations, electrical insulators may be applied to both the first heat transfer fin 518-1 and the first transmit antenna 516-1.

The first transmit antenna 516-1 may be held within the recess 604 of the first heat transfer fin 518-1. For example only, the first transmit antenna 516-1 may be fixed to the recess 604 using an adhesive, held within the recess 604 via one or more retaining devices (e.g., clips), held within the recess 604 via an interference fit between the first and second electrical connectors 612 and 616, held within the recess 604 via an interference fit between the first transmit antenna 516-1 and the first heat transfer fin 518-1, or held within the recess 604 in another suitable manner.

The integration of the transmit and receive antennas into the heat transfer fins provides a more aesthetically pleasing design than wireless communication devices with external antennas that extend outwardly. Additionally, the integration of the transmit and receive antennas into the heat transfer fins may enable the transmit and receive antennas to be larger in size than those found in wireless communication devices with external antennas that extend outwardly. The larger size may provide superior wireless transmission and receipt characteristics than wireless communication devices with such external antennas that extend outwardly.

In this application, the term electronic circuit may refer to, be part of, or include an Application Specific Integrated Circuit (ASIC); a digital, analog, or mixed analog/digital discrete circuit; a digital, analog, or mixed analog/digital circuit; a combinational logic circuit; a field programmable gate array (FPGA); a processor (shared, dedicated, or group) that executes code; memory (shared, dedicated, or group) that stores code executed by a processor; other suitable hardware components that provide the described functionality; or a combination of some or all of the above, such as in a system-on-chip.

The term code, as used above, may include software, firmware, and/or microcode, and may refer to programs, routines, functions, classes, and/or objects. The term shared processor encompasses a single processor that executes some or all code from multiple modules. The term group processor encompasses a processor that, in combination with additional processors, executes some or all code from one or more modules. The term shared memory encompasses a single memory that stores some or all code from multiple modules. The term group memory encompasses a memory that, in combination with additional memories, stores some or all code from one or more modules. The term memory may be a subset of the term computer-readable medium. The term computer-readable medium does not encompass transitory electrical and electromagnetic signals propagating through a medium, and may therefore be considered tangible and non-transitory. Non-limiting examples of a non-transitory tangible computer readable medium include nonvolatile memory, volatile memory, magnetic storage, and optical storage.

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. An electronic device comprising:
a housing having one or more interior surfaces;
an electronic circuit that is disposed within the housing, that does not directly contact any of the one or more interior surfaces of the housing, and that includes at least one electrical component that consumes electrical power, wherein the electronic circuit includes a receiver device that receives audio/visual (A/V) signals from a satellite via a satellite antenna and that outputs A/V signals to a display; and
a thermally conductive material that surrounds the electronic circuit within the housing, that directly contacts both the at least one electrical component and the one or more interior surfaces of the housing, that absorbs heat from the at least one electrical component, and that transfers heat to the housing.

2. The electronic device of claim 1 further comprising a plurality of heat transfer fins that project outwardly from the housing and that transfer heat to air passing the heat transfer fins.

3. The electronic device of claim 2 wherein the plurality of heat transfer fins are formed on an exterior surface of the housing.

4. The electronic device of claim 2 wherein the plurality of heat transfer fins are fixed to and directly contact an exterior surface of the housing.

5. The electronic device of claim 2 wherein the plurality of heat transfer fins include aluminum.

6. The electronic device of claim 2 wherein characteristics of the thermally conductive material, the housing, and the heat transfer fins are selected based on power consumption of the electronic device.

7. The electronic device of claim 6 wherein the characteristics of the thermally conductive material, the housing, and the heat transfer fins are selected further based on a size of the housing.

8. The electronic device of claim 2 wherein shape and size of the heat transfer fins is selected based on power consumption of the electronic device.

9. The electronic device of claim 1 wherein the thermally conductive material is a thermally conductive gel.

10. The electronic device of claim 9 wherein the thermally conductive material is one of a thermally conductive paste, a thermally conductive semisolid, and a thermally conductive colloid.

11. The electronic device of claim 1 wherein the thermally conductive material electrically isolates the electronic circuit from the housing.

12. The electronic device of claim 1 wherein the thermally conductive material includes carbon.

13. The electronic device of claim 1 wherein the housing includes at least one metal.

14. The electronic device of claim 1 wherein the housing includes aluminum.

15. The electronic device of claim 1 wherein the receiver device outputs the A/V signals to the display via a wired connection between the receiver device and the display.

16. The electronic device of claim 1 wherein:
the electronic device further comprises a computer readable medium; and
the electronic circuit further comprises a digital video recorder that stores A/V data in the computer readable medium.

17. The electronic device of claim 16 wherein the electronic circuit further comprises a network gateway that is connected to a computer network by wire and that communicates over the computer network using an Internet Protocol (IP) communication standard.

18. The electronic device of claim 17 wherein the electronic circuit further comprises:
a wireless transmitter that outputs wireless signals via a transmit antenna; and
a wireless receiver that receives wireless signals via a receive antenna.

19. The electronic device of claim 18 wherein the wireless transmitter generates the wireless signals according to an IEEE (Institute of Electrical and Electronics Engineers) 802.11 standard.

* * * * *